United States Patent [19]

Eidelman et al.

[11] Patent Number: 5,792,253

[45] Date of Patent: Aug. 11, 1998

[54] FORGING CYLINDRICAL INGOTS OF ALKALI HALIDES

[75] Inventors: Lev G. Eidelman, Hoffman Estates; Olexy V. Radkevich, Schaumburg, both of Ill.

[73] Assignee: Siemens Medical Systems, Inc., Iselin, N.J.

[21] Appl. No.: 681,144

[22] Filed: Jul. 22, 1996

[51] Int. Cl.$^6$ .................................................. C30B 15/36
[52] U.S. Cl. ................... 117/2; 117/1; 117/3; 117/937
[58] Field of Search .................... 117/1, 2, 3, 902, 117/937; 264/319, 320

[56] References Cited

U.S. PATENT DOCUMENTS

| | | |
|---|---|---|
| 3,794,704 | 2/1974 | Strong . |
| 3,933,970 | 1/1976 | Rosette et al. . |
| 4,031,190 | 6/1977 | Bernal et al. ........................... 423/466 |
| 4,171,400 | 10/1979 | Rosette et al. ........................... 428/357 |
| 4,203,951 | 5/1980 | Goriletsky et al. . |
| 4,410,468 | 10/1983 | Packer ........................... 264/1.23 |
| 4,522,865 | 6/1985 | Packer ........................... 428/212 |

FOREIGN PATENT DOCUMENTS

59141500 A 8/1984 Japan .

*Primary Examiner*—Felisa Garrett
*Attorney, Agent, or Firm*—Mark H. Jay, Esq.

[57] ABSTRACT

A cylindrical alkali halide single-crystal-type ingot having an axis generally coinciding with the [001] crystallographic direction is compressed in a heated dual platen press. To produce an approximately rectangular compressed ingot that is devoid of cracks and fissures at and adjacent the periphery, the surface of the ingot is flatted. For crystals having a face-centered lattice (e.g. NaI), the flat is parallel to the (100) crystallographic plane. For crystals having a body-centered lattice (e.g. CsI), the flat is parallel to the (110) crystallographic plane. The flat is placed on the lower platen of the press to properly orient the crystallographic structure of the ingot with respect to the direction of compression.

8 Claims, 4 Drawing Sheets

FORGING CYLINDRICAL INGOTS OF ALKALI HALIDES

BACKGROUND OF THE INVENTION

The invention relates to alkali halide scintillation crystals more particularly relates to methods by which alkali halide scintillation crystals may be manufactured. In its most immediate sense, the invention relates to hot forging of NaI(Tl) scintillation crystals so as to produce crystals having a large area and a rectangular shape.

Manufacturers of alkali halide crystals (including NaI(Tl) crystals) have long attempted to enlarge and shape melt-grown crystal ingots by forging them at elevated temperatures. Crystal forging techniques are taught, for example, in U.S. Pat. Nos. 3,933,970 and 4,171,400. These patents disclose hot forging in which there is a gradual compression of the crystal ingot between two surfaces. If a cylindrical ingot is flattened parallel to its axis, the forging process produces a disk-shaped crystal having a circular cross-section; if the cylindrical ingot is flattened perpendicular to its axis, the forging process produces a parallelepiped-shaped crystal having a rectangular cross-section. However, existing forging techniques are unsatisfactory.

This is because conventional forging techniques produce forged crystals having cracks and fissures at and adjacent the periphery of the crystal. As a result, the peripheral region of the forged crystal is not useful and must be cut away. This limits the size of the crystals that can be produced using the forging process. It also reduces the yield of the process because only a fraction of the forged crystal is useful; the rest of the crystal must be recycled.

It would be advantageous to provide a method of forging an alkali halide crystal ingot, particularly a NaI(Tl) crystal ingot, which would produce forged scintillators having no cracks or fissures at the periphery of the forged crystal.

One object of the invention is to provide a forging method for use on an alkali halide single crystal ingot, by which method the forged crystal is devoid of peripheral cracks and fissures.

Another object of the invention is to provide a forging method that will forge an alkali halide single crystal ingot having a cylindrical shape into a forged crystal having a rectangular cross-section.

Still another object is, in general, to improve on known methods for forging and manufacturing alkali halide scintillators.

The invention proceeds from the realization that peripheral cracking and fissuring results from internal stresses. These stresses are caused by uncontrolled slippage-along multiple slip planes within the crystal ingot. In accordance with the invention, a single-crystal-type ingot is compressed in a particular direction with respect to its crystallographic structure. By doing this, peripheral cracking and fissuring is completely eliminated. Although a single crystal ingot is most advantageous, it is not essential that the entire ingot be a single crystal. It is alternatively possible to use a crystal ingot that has a relatively small number of crystals, as long as it is possible, in an overall sense, to orient the crystallographic structure of the ingot with respect to the axis of compression. Hereinafter, the term "single-crystal-type" is used to refer to ingots that are either single crystals or that are made up of a relatively small number of crystals.

Advantageously, and in accordance with the preferred embodiment, the single-crystal-type ingot is heated to a particular temperature and maintained at that temperature during compression. The temperature is lower than the melting point of the ingot material and is sufficiently high that the crystal becomes relatively plastic. By doing this, comparatively low compression forces can be used.

BRIEF DESCRIPTION OF THE DRAWINGS

The invention will be better understood with reference to the following illustrative and non-limiting drawings, in which.

DETAILED DESCRIPTION OF PREFERRED EMBODIMENTS

The preferred embodiment of the invention uses NaI, particularly Tl-doped NaI. This is because NaI(Tl) is presently preferred as a scintillator for scintillation cameras. NaI has a crystallographic structure of the face-centered lattice type. Although the preferred embodiment of the invention will be described with specific reference to NaI(Tl), other alkali halide crystals having the crystallographic structure of a face-centered lattice can be forged in the same way or in a similar way. Furthermore, it is also possible to forge alkali halide crystals having crystallographic structures of the body-centered lattice type (CsI is an example) in the same way or in a similar way. The invention herein is not limited to NaI(Tl).

Figure 1A:
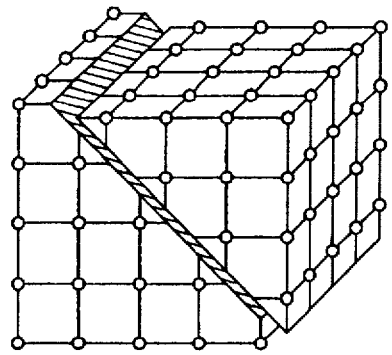
FIGS. 1a, 1b and 1c are schematic diagrams illustrating geometrically possible slip systems in NaI crystals.
Figure 1B:
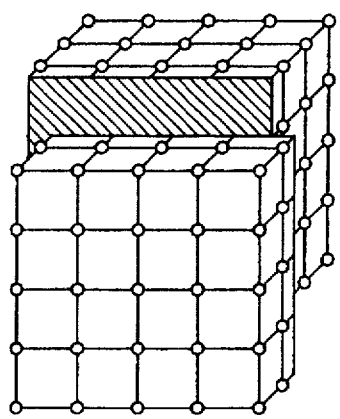
Figure 1C:
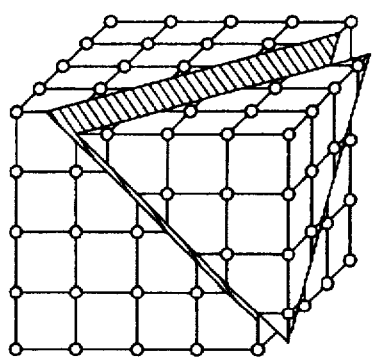

NaCl-type crystals, of which NaI(Tl) crystals are an example, have three possible slip systems as illustrated in FIG. 1. At room temperature, slips can occur only along {110}planes (FIG. 1a). At elevated temperatures, slips can also take place along {100}planes (FIG. 1b) and {111}planes (FIG. 1c). Even though the slip direction is <111> in all three instances, less shear stress is required to cause a slip along {110}planes than is required to cause a slip along {100}planes or along {111}planes. For this reason, {110}planes are known as "planes of easy slip" and, correspondingly, the {110}<111> system is known as a "system of easy slip". If a force of deformation is applied to an NaCl-type crystal and the shear stress in the system of easy slip is larger than in any of the other slip systems, then deformation of the crystal will only take place in the {110}<111> system of easy slip. In other words, if a crystal is so compressed as to cause the shear stress in the system of easy slip to be greater than the shear stress in any of the other slip systems, this will eliminate uncontrolled multiple slip in all the other possible slip planes and will limit crystal deformation to the system of easy slip.

Figure 2:
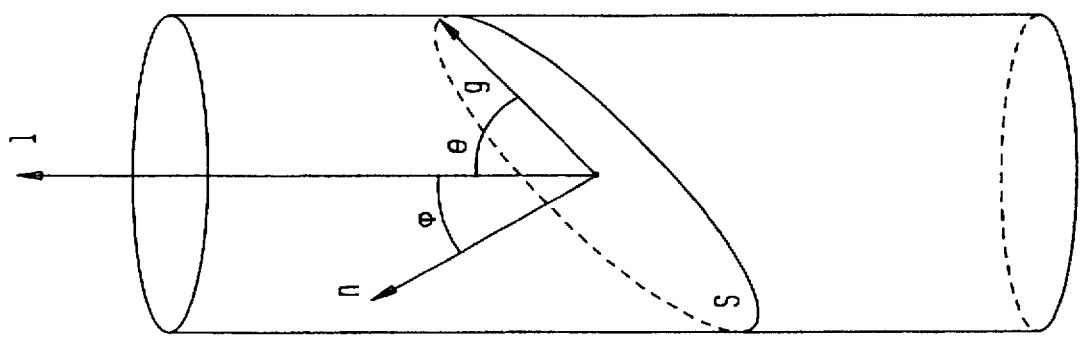
FIG. 2 is a schematic diagram illustrating the geometric relationship between the axis along which a crystal is compressed, a slip plane in the crystallographic structure of the crystal and a slip direction along that slip plane.

FIG. 2 shows how shear stress in a slip plane in a single crystal depends upon on the geometry of how the crystal is compressed. The single crystal is compressed along direction 1 under the action of the normal stress $\sigma$. The slip plane S, having the normal n, experiences the stress $\sigma \cdot \cos \phi$, and its component along slip direction g (i.e. shear stress) is equal to T=σ• cos φ• cos θ, wherein the expression cos φ• cos θ is known as the "orientation factor".

It follows from this relationship that if the orientation factor is maximized, the shear stress will attain its possible maximal value. Maximization of the orientation factor takes place when φ=θ=45°. Therefore, if both the slip direction and the normal to the plane of easy slip are inclined at angles of 45° to the compression axis, the shear stress in the system of easy slip will be larger than in any of the other slip systems.

In accordance with the preferred embodiment of the invention, the slip direction is at 45° to the compression axis and the plane of easy slip is likewise at 45° to the compression axis. This is accomplished by starting with a cylindrical single-crystal-type NaI(Tl) ingot in which the axis lies along the [001] crystallographic direction. Then, the surface of this ingot is flatted parallel to the (100) crystallographic plane. The flat is placed upon the lower platen of a dual-platen press, and the ingot is then compressed at an elevated temperature.

Figure 3:
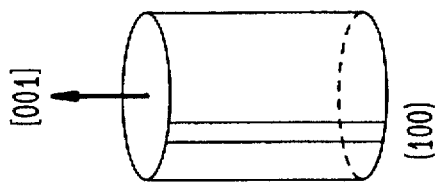
FIG. 3 shows a cylindrical NaI(Tl) single crystal ingot with a side flat in the (100) plane parallel to the [001] ingot axis.

FIG. 3 illustrates a cylindrical NaI(Tl) single crystal ingot having a small flat along the (100) plane parallel to the [001] axis of the ingot. Such an ingot can be pulled from a melt using the process disclosed in U.S. Pat. No. 4,203,951. Although this methodology for producing the ingot is preferred, it is not required and is not part of the invention. It is alternatively possible to start with a cylindrical (or generally cylindrical, absolute cylindrical uniformity being unnecessary) single-crystal-type ingot produced by any other technique, provided that its axis (or axes) lies along the [001] crystallographic direction or are generally aligned with the [001] crystallographic direction. In other words, the ingot need not be absolutely cylindrical and need not be a single crystal, and the crystal structure of the ingot need not be absolutely uniform. Acceptable results will be obtained if the ingot is generally cylindrical, if the ingot is not excessively polycrystalline and if the ingot does not have an excessively nonuniform crystal structure.

Figure 4:
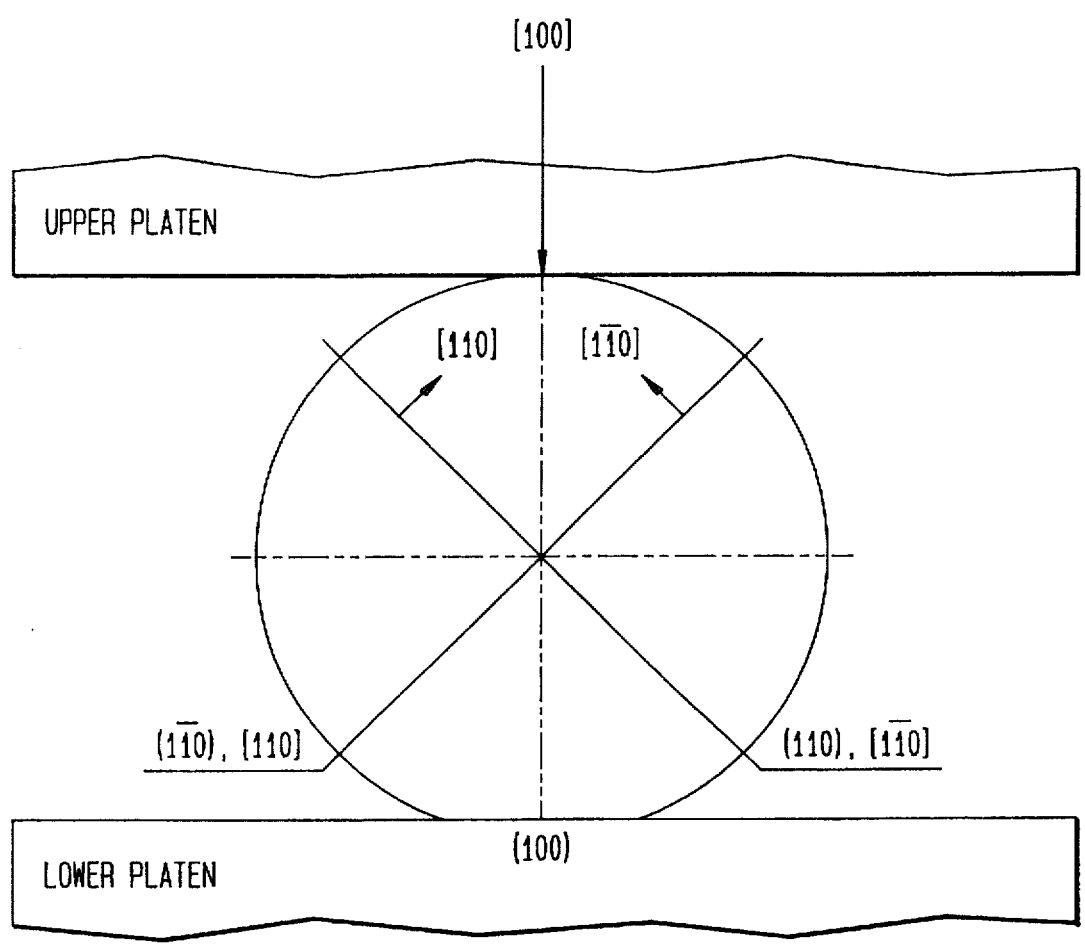
FIG. 4 shows how the FIG. 3 ingot is placed in a dual platen press with the flat on the lower platen.
Figure 5:
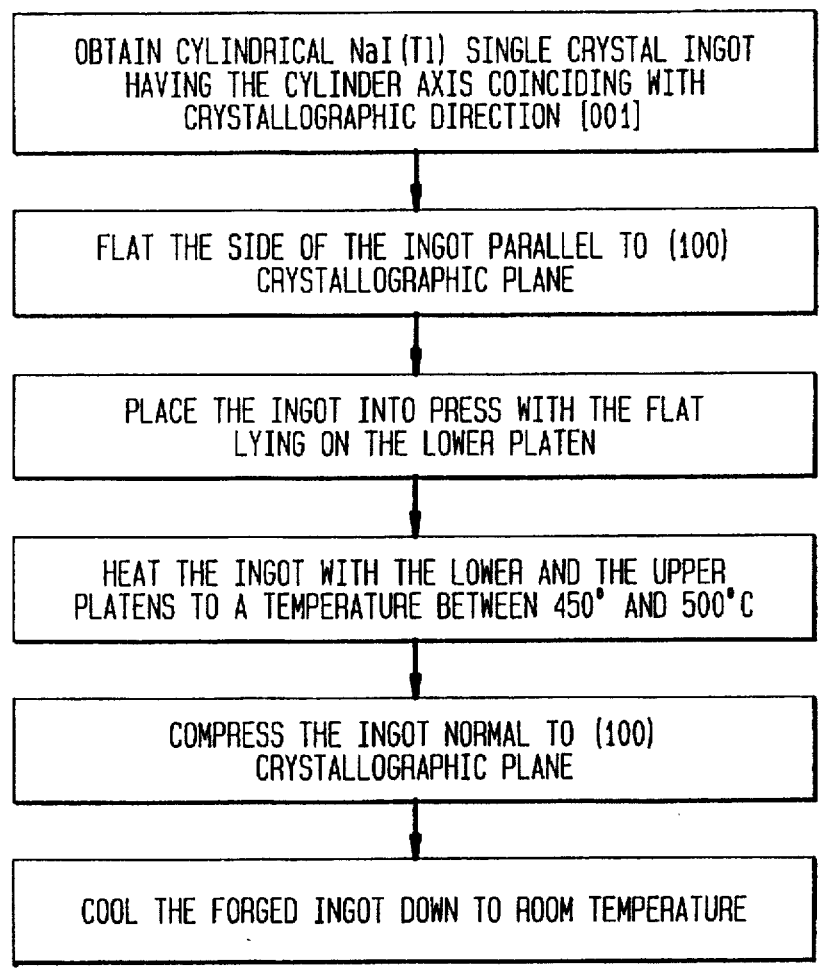
FIG. 5 is a flow chart showing a preferred embodiment of the invention.

As shown in FIG. 4, if the surface of a cylindrical single-crystal-type NaI(Tl) ingot is flatted parallel to the (100) crystallographic plane and the ingot is placed in a dual platen press with the flat on the lower platen, both the slip directions [110], [110] and the normals to the planes (110), (110) of easy slip are inclined at angles 45 degrees to the compression axis [100]. The same is true for directions [101], [101] (not shown) and planes of easy slip (101), (101) (also not shown). Therefore, a compression of the ingot between the lower platen and the upper platen will cause a deformation in which only four of the six possible planes of the system of easy slip {110}<110>participate; in all other slip systems shear stresses will be significantly less so that such other slip systems will be inactive.

In accordance with the preferred embodiment, the ingot is raised slowly from room temperature to a temperature between 450° C. and 500° C. and maintained at that temperature in a heated dual-platen press. For a NaI(Tl) ingot 450 mm in diameter and 430 mm long it takes approximately four days to reach 500° C., at which temperature the NaI(Tl) is plastic and can be forged using a pressure of approximately 80 tons. Then, over approximately 5 hours, the ingot is slowly compressed between the lower and upper platens.

This compression flattens out the ingot from its initial diameter of 450 mm to a final thickness of 175 mm. After this step has been carried out and the pressure has been released, the forged ingot is cooled down to 60° C. over four days and self-cooled from 60° C. to room temperature over another day. The stated times for heating, compression and cooling depend upon the dimensions of the ingot; persons skilled in the art can adjust them for different ingot sizes.

The forged ingot has a generally rectangular cross-section and is devoid of peripheral cracks and fissures. A rectangular parallelepiped inscribed within the forged NaI(Tl) ingot has a length of 600 mm, a width of 470 mm, and a thickness of 175 mm. That inscribed parallelepiped is cut out and subdivided into ten to fifteen plates, each being 590.6 mm long by 444.5 mm wide by 9.5 mm thick. Each of these plates is suitable for use as a scintillator in the detector of a scintillation camera.

Advantageously, and in accordance with the preferred embodiment, the lower and upper platens are covered with thermo resistant fiberglass cloth impregnated with powdery boron nitride. The cloth prevents the ingot from actually touching the metal platens, boron nitride prevents the cloth from sticking to the crystal, and both make it easier to remove the ingot safely after it has been compressed and cooled.

In the preferred embodiment the ingot is compressed by lifting the lower platen. This is because after the release of the pressure the ingot will not under any circumstances remain under pressure, as could accidentally occur if the ingot were to be compressed by lowering the upper platen.

As mentioned above, CsI and other alkali halide single crystals having a body centered lattice can also be forged in the same way or in a similar way. As compared with NaI, such crystals have the same crystallographic planes of easy slip {110}, but other slip directions <100>. In accordance with this characteristic, a flat on the side of a cylindrical CsI single-crystal-type ingot, having its axis along the [001] crystallographic direction, must be cut parallel to the crystallographic plane (110), resulting in the angle of 45 degrees between the compression axis and the slip directions. Suitable plasticity of CsI can be achieved by heating the CsI to a temperature of approximately 420° C. to 470° C.

Although a preferred embodiment has been described above, the scope of the invention is limited only by the following claims:

We claim:

1. A method of forging a generally cylindrical alkali halide single-crystal-type ingot of a crystal material having a crystallographic structure of a face-centered lattice type, the ingot having an axis generally coinciding with the [001] crystallographic direction, comprising the following steps:

heating the ingot to a temperature below the melting point of the alkali halide; and applying pressure to the ingot along a direction that is normal both to the ingot axis and to the (100) crystallographic plane.

2. A method of forging a generally cylindrical alkali halide single-crystal-type ingot of a crystal material having a crystallographic structure of a body-centered lattice type, the ingot having an axis generally coinciding with the [001] crystallographic direction, comprising the following steps:

heating the ingot to a temperature below the melting point of the alkali halide; and applying pressure to the ingot along a direction that is normal both to the ingot axis and to the (110) crystallographic plane.

3. A method of claim 1 or claim 2, further comprising the following steps:
- cutting a flat on the side of the ingot, said flat being parallel both to the ingot axis and to said crystallographic plane, and said cutting step being carried out before the ingot has been heated;
- supporting the ingot upon the lower platen of a press having parallel upper and lower platens, with the flat lying on the lower platen;
- heating the ingot to said temperature;
- moving at least one of the upper and lower platens toward the other platen and compressing the ingot therebetween, thereby applying pressure to the ingot along a direction that is normal to the plane of the flat; and
- cooling the ingot to room temperature.

4. The method of claim 3, wherein the alkali halide is sodium iodide and said temperature is between 450° C. and 500° C.

5. The method of claim 3, wherein the alkali halide is cesium iodide and said temperature is between 420° C. and 470° C.

6. The method of claim 3, wherein the ingot is compressed from an initial diameter of approximately 450 mm to a final thickness of approximately 175 mm.

7. The method of claim 3, wherein each of the platens of the press is covered with fiberglass cloth impregnated with boron nitride and thereby physically separated from the ingot.

8. The method of claim 3, wherein the heating step is carried out over approximately 4 days, wherein the moving step is carried out over approximately 5 hours, and wherein the cooling step is carried out over approximately 5 days including one day of self-cooling from a temperature of 60° C.

* * * * *